(12) United States Patent
Kuo

(10) Patent No.: US 11,061,199 B2
(45) Date of Patent: Jul. 13, 2021

(54) LENS STRUCTURE

(71) Applicant: Chicony Electronics Co., Ltd., New Taipei (TW)

(72) Inventor: Che-Wei Kuo, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 231 days.

(21) Appl. No.: 16/224,199

(22) Filed: Dec. 18, 2018

(65) Prior Publication Data

US 2019/0187400 A1 Jun. 20, 2019

(30) Foreign Application Priority Data

Dec. 18, 2017 (TW) .................................. 106218780

(51) Int. Cl.
*G02B 7/02* (2021.01)
*H05K 9/00* (2006.01)

(52) U.S. Cl.
CPC ........... *G02B 7/021* (2013.01); *H05K 9/0049* (2013.01)

(58) Field of Classification Search
None
See application file for complete search history.

(56) References Cited

U.S. PATENT DOCUMENTS

| | | | |
|---|---|---|---|
| 2008/0278621 A1* | 11/2008 | Cho ..................... | H04N 5/2257 348/374 |
| 2015/0271372 A1* | 9/2015 | Sekimoto ................ | G02B 7/08 348/335 |
| 2016/0097912 A1* | 4/2016 | Kobori ................ | H04N 5/2254 359/820 |
| 2016/0313628 A1* | 10/2016 | Brodie .................... | G03B 3/10 |
| 2019/0187255 A1* | 6/2019 | Jang ...................... | G02B 7/021 |
| 2019/0310490 A1* | 10/2019 | Park ...................... | G03B 13/32 |

* cited by examiner

*Primary Examiner* — Christopher Stanford
*Assistant Examiner* — Journey F Sumlar
(74) *Attorney, Agent, or Firm* — Muncy, Geissler, Olds & Lowe, P.C.

(57) ABSTRACT

A lens structure includes a lens barrel, a lens upper cover, a lens lower cover, and a sealing ring. The lens barrel includes a front portion and a rear portion respectively at two opposite ends on an axial direction. The lens barrel has an external annular wall. The lens upper cover is fixed to the front portion. The lens upper cover includes a lower flange and an abutting ring radially protruded from an outer periphery of the lower flange. An inner diameter of the lower flange is greater than an outer diameter of the external annular wall. The lens lower cover forms an annular shape and abuts against the lens upper cover. The lens lower cover is fixed to the lower flange. The lens lower cover, the lower flange, and the abutting ring jointly form an annular slot. The sealing ring is received in the annular slot.

8 Claims, 4 Drawing Sheets

LENS STRUCTURE

CROSS-REFERENCE TO RELATED APPLICATION

This non-provisional application claims priority under 35 U.S.C. § 119(a) to Patent Application No. 106218780 filed in Taiwan, R.O.C. on Dec. 18, 2017, the entire contents of which are hereby incorporated by reference.

BACKGROUND

Technical Field

The instant disclosure relates to a lens structure and, more particularly, to a lens structure with a lens upper cover and a lens lower cover.

Related Art

At present, a usual lens structure is mostly provided with an annular lens cover at a front end of a lens barrel to increase the strength of the lens structure. In general, the annular lens cover usually adopts materials with greater specific weight to enhance the stability of focusing of the lens structure.

Static electricity may occur during processes of manufacturing, assembling, testing, and using of the lens structure. Static electricity is mostly accumulated in internal circuits, components, or circuit boards. If components accumulated with static electricity are close to one another or human bodies accumulated with static electricity contact the electronic components, a discharging path may be formed and electrostatic discharge (ESD) may occur, which results in damages of the internal circuits and components caused by electrostatic discharge.

SUMMARY

The instant disclosure provides a lens structure, which comprises a lens barrel, a lens upper cover, a lens lower cover, and a sealing ring. The lens barrel comprises a front portion and a rear portion respectively at two opposite ends on an axial direction of the lens barrel. The lens barrel further comprises an external annular wall. The lens upper cover is fixed to the front portion. The lens upper cover comprises a lower flange and an abutting ring radially protruded from an outer periphery of the lower flange. An inner diameter of the lower flange is greater than an outer diameter of the external annular wall. The lens lower cover forms an annular shape and abuts against the lens upper cover. The lens lower cover is fixed to the lower flange. The lens lower cover, the lower flange, and the abutting ring jointly form an annular slot. The sealing ring is received in the annular slot.

Concisely, the lens cover of embodiments of the instant disclosure may be jointly formed by the lens upper cover and the lens lower cover. In an embodiment, the lens upper cover and the lens lower cover may adopt different materials. Types of the lens upper cover and the lens lower cover may be adjusted to increase mechanical properties (e.g., stability of focusing) and reduce material cost. In an embodiment, the lens upper cover is a metal upper cover, the lens lower cover is a plastic lower cover, and the plastic lower cover is closer to the circuit board inside the lens structure than the metal upper cover is; therefore, transmitting paths for electrostatic charges can be increased to prevent electrostatic charges from being accumulated in the metal upper cover, which results in occurrence of electrostatic discharge that may damage circuits on the circuit board. In another embodiment, the shape and structure of the lens lower cover (e.g., an external flange and/or an internal flange) may be adjusted to not only enhance the strength of combination between the lens lower cover and the lens upper cover but also prevent corners of the metal upper cover from point discharging, which leads to damaging circuits on internal circuit board.

DETAILED DESCRIPTION

Figure 1:
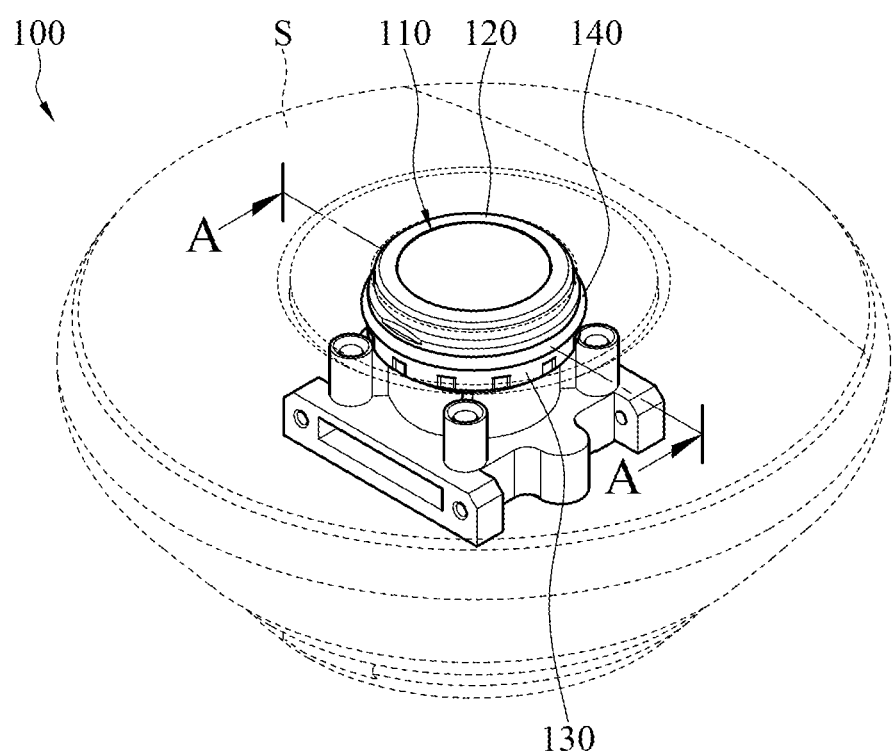
FIG. 1 illustrates a perspective view of a lens structure according to an embodiment of the instant disclosure.
Figure 2:
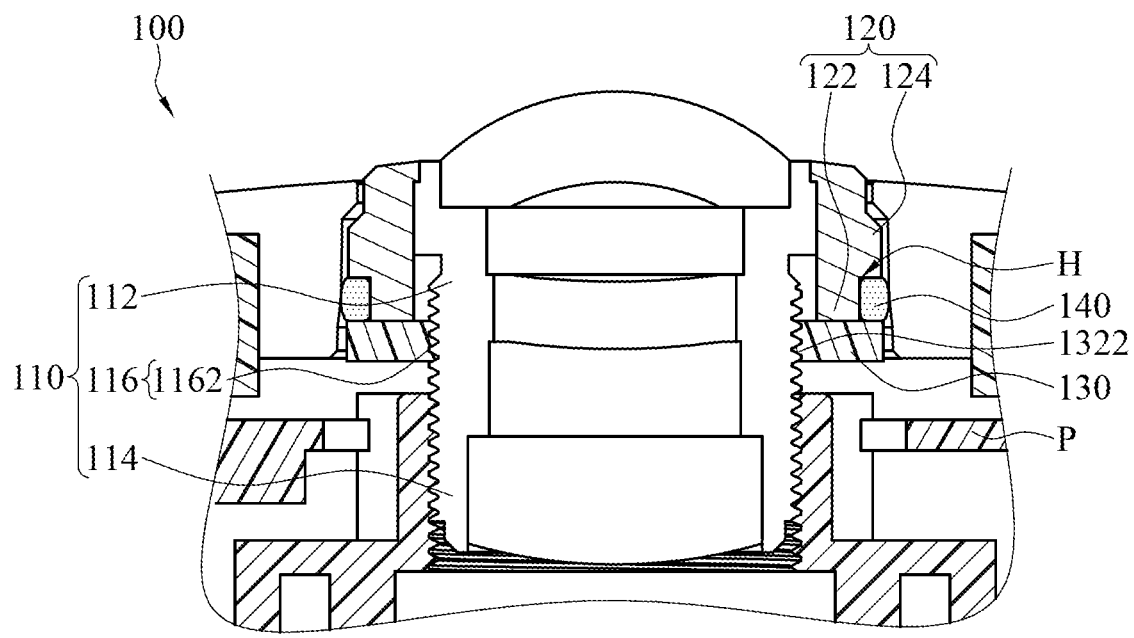
FIG. 2 illustrates a cross sectional view of the lens structure corresponding to the A-A line of FIG. 1 according to an embodiment.

FIG. 1 is a perspective view of a lens structure according to an embodiment of the instant disclosure. FIG. 2 is a cross sectional view of the lens structure corresponding to the A-A line of FIG. 1. The lens structure 100 comprises a lens barrel 110, a lens upper cover 120, a lens lower cover 130, and a sealing ring 140. The lens upper cover 120 is fixed to the lens barrel 110, and the lens lower cover 130 abuts against the lens upper cover 120. The lens upper cover 120 and the lens lower cover 130 jointly form an annular slot H to receive the sealing ring 140. Wherein, the lens structure 100 may further comprise a housing body S to house the lens barrel 110, the lens upper cover 120, the lens lower cover 130, and the sealing ring 140. It is noted that a contour of the housing body S is illustrated by dotted lines to expressly display connections of components.

The lens barrel 110 comprises a front portion 112 and a rear portion 114. The front portion 112 and the rear portion 114 are respectively at two opposite ends on an axial direction of the lens barrel 110. The front portion 112 and the rear portion 114 are communicated with each other. That is, an inside of the lens barrel 110 has a receiving space extending along the axial direction. Wherein, there is a filming optical unit inside the receiving space. The lens barrel 110 comprises an external annular wall 116. The external annular wall 116 is an outside wall of the lens barrel 110.

The lens upper cover 120 is fixed to the front portion 112 of the lens barrel 110. The lens upper cover 120 comprises a lower flange 122 and an abutting ring 124. The abutting ring 124 is radially protruded from an outer periphery of the lower flange 122. An inner diameter of the lower flange 122 is greater than an outer diameter of the external annular wall 116. In other words, on the axial direction of the lens barrel 110, a boundary of a perpendicular projection of the abutting ring 124 is greater than a boundary of a perpendicular projection of the lower flange 122. In an embodiment, the lens upper cover 120 is a metal upper cover, which is, for example and not limited to, a singular metal material or an alloy material.

The lens lower cover 130 forms an annular shape and is fixed to the lower flange 122 of the lens upper cover 120. In an embodiment, the lens lower cover 130 is under the lens upper cover 120. The lens lower cover 130 directly contacts the lower flange 122 or indirectly contacts the lower flange 122 via a gasket, a plastic material, or an O-ring there between. The lens lower cover 130, the lower flange 122 of the lens upper cover 120, and the abutting ring 124 jointly form the annular slot H. In another embodiment, the lens lower cover 130 is an electrically insulating lower cover, which is, for example and not limited to, a plastic lower cover, a bakelite lower cover, a rubber lower cover, or a polymer composite lower cover.

The sealing ring 140 is received in the annular slot H. In an embodiment, the sealing ring 140 may be an O-ring. The sealing ring 140 is mainly used to prevent foreign substance such as dust and steam from entering the inside of the mechanism. In another embodiment, a size of a cross sectional area of the sealing ring 140 is substantially equal to that of the receiving space of the annular slot H, which is benefit to sealing effect of the sealing ring 140.

In the embodiment, the lens cover may be jointly formed by the lens upper cover 120 and the lens lower cover 130. In an embodiment, the lens upper cover 120 and the lens lower cover 130 may adopt different materials. Types of the lens upper cover 120 and the lens lower cover 130 may be adjusted to reduce material cost. For example, the lens upper cover 120 is a metal upper cover, and the lens lower cover 130 is a plastic lower cover. Since the specific weight of a metal is greater than that of a plastic (or a polymer material), the stability of focusing of the lens structure 100 can be enhanced, and the material cost can be lowered. In addition, the plastic lower cover is closer to the circuits inside the lens structure 100 (e.g., a circuit board P in the drawing) than the metal upper cover is, so that transmitting paths for electrostatic charges can be increased to prevent electrostatic charges from being accumulated in the metal upper cover, which results in occurrence of electrostatic discharge that may damage the circuits on the circuit board P.

Figure 3:
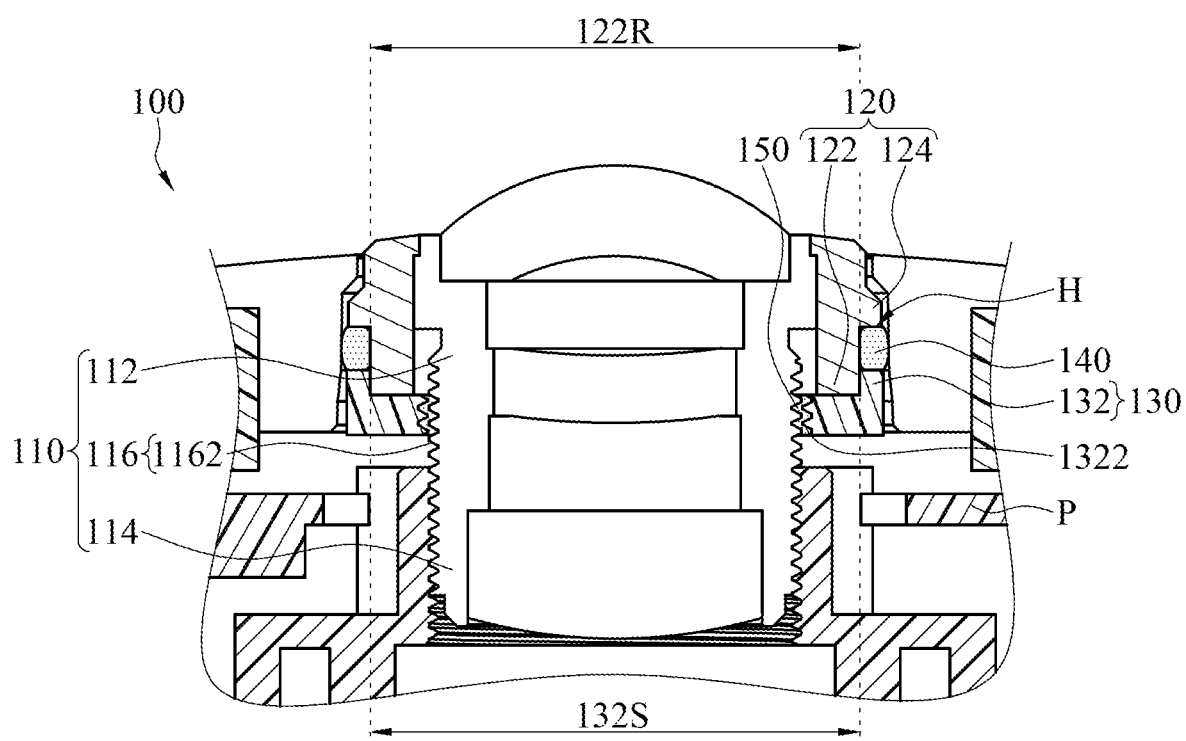
FIG. 3 illustrates a cross sectional view of the lens structure corresponding to the A-A line of FIG. 1 according to another embodiment.

FIG. 3 is a cross sectional view of the lens structure corresponding to the A-A line of FIG. 1 according to another embodiment. Please refer to FIG. 1 and FIG. 3. In the embodiment, the connecting relationship and the types of the lens barrel 110, the lens upper cover 120, the lens lower cover 130, and the sealing ring 140 are substantially the same as those in the previous embodiments and thus there is no need to go into details. In some embodiments, the lens lower cover 130 may further comprise an external flange 132. The external flange 132 is protruded towards the abutting ring 124 of the lens upper cover 120. The external flange 132, the lower flange 122, and the abutting ring 124 jointly form the annular slot H. An inner diameter 132S of the external flange 132 is greater than an outer diameter 122R of the lower flange 122. Wherein, the outer diameter is a diameter or a width of an outer periphery. In other words, on the axial direction of the lens barrel 110, a boundary of an inner periphery of a perpendicular projection of the external flange 132 is greater than a boundary of an outer periphery of a perpendicular projection of the lower flange 122. In the embodiment, the external flange 132 of the lens lower cover 130 may be combined with the lower flange 122 of the lens upper cover 120. In the embodiment, the inner diameter 132S of the external flange 132 may be greater than or substantially equal to the outer diameter 122R of the lower flange 122, such that the lower flange 122 is combined with the external flange 132 in a loose fit (or a clearance fit). Nonetheless, in other embodiments, the external flange 132 may also be combined with the lower flange 122 in a tight fit. In yet another embodiment, the lens upper cover 120 is a metal upper cover, and the lens lower cover 130 is a plastic lower cover. The external flange 132 of the plastic lower cover may cover the lower flange 122 of the metal upper cover, which is benefit to prevent corners of the lower flange 122 of the metal upper cover from point discharging, which leads to damaging internal circuits inside the lens structure 100 (e.g., the circuit board P in the drawing).

Figure 4:
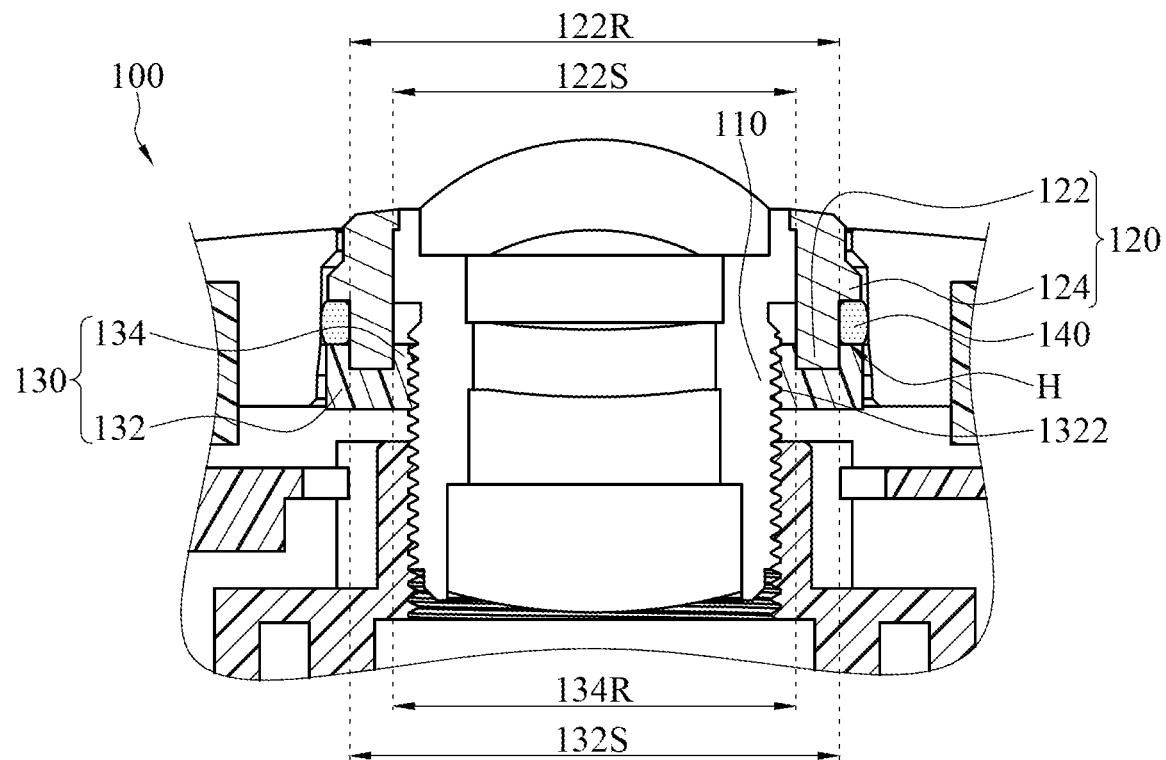
FIG. 4 illustrates a cross sectional view of the lens structure corresponding to the A-A line of FIG. 1 according to another embodiment.

FIG. 4 is a cross sectional view of the lens structure corresponding to the A-A line of FIG. 1 according to another embodiment. Please refer to FIG. 1 and FIG. 4. In the embodiment, the connecting relationship and the types of the lens barrel 110, the lens upper cover 120, the lens lower cover 130, and the sealing ring 140 are substantially the same as those in the previous embodiments and thus there is no need to go into details. In some embodiments, the lens lower cover 130 may further comprise an external flange 132 and an internal flange 134. The external flange 132 is protruded towards the abutting ring 124 of the lens upper cover 120. The lower flange 122 is between the internal flange 134 and the external flange 132. An inner diameter 132S of the external flange 132 is greater than an outer diameter 122R of the lower flange 122. An outer diameter 134R of the internal flange 134 is less than an inner diameter 122S of the lower flange 122. In other words, on the axial direction of the lens barrel 110, a boundary of an inner periphery of a perpendicular projection of the external flange 132 is greater than a boundary of an outer periphery of a perpendicular projection of the lower flange 122, and a boundary of an outer periphery of a perpendicular projection of the internal flange 134 is less than a boundary of an inner periphery of the perpendicular projection of the lower flange 122. In the embodiment, the lower flange 122 extends to an annular groove space between the external flange 132 and the internal flange 134. In the embodiment, the external flange 132 and the internal flange 134 of the lens lower cover 130 may be combined with the lower flange 122 of the lens upper cover 120. In the embodiment, the inner diameter 132S of the external flange 132 may be greater than or substantially equal to the outer diameter 122R of the lower flange 122, and the outer diameter 134R of the internal flange 134 may be less than or substantially equal to the inner diameter 122S of the lower flange 122, such that the lower flange 122 is combined with the external flange 132 and the internal flange 134 in a loose fit (or a clearance fit). Nonetheless, in other embodiments, the external flange 132 and the internal flange 134 may also be combined with the lower flange 122 in a tight fit. In yet another embodiment, the lens upper cover 120 is a metal upper cover, and the lens lower cover 130 is a plastic lower cover. The external flange 132 of the plastic lower cover may cover the lower flange 122 of the metal upper cover, which is benefit to prevent corners of the lower flange 122 of the metal upper cover from point discharging, which leads to damaging internal circuits inside the lens structure 100 (e.g., the circuit board P in the drawing).

In yet another embodiment, the external annular wall 116 of the lens barrel 110 may be provided with an external thread 1162, and the lens lower cover 130 is provided with an internal thread 1322, as shown in FIG. 2, FIG. 3, and FIG. 4. In the embodiment, the internal thread 1322 of the lens lower cover 130 may be screwed to the external thread 1162 of the lens barrel 110. In an embodiment, as shown in FIG. 2 and FIG. 3, the lens lower cover 130 is of an annular shape, and the internal thread 1322 of the lens lower cover 130 is disposed on an inner annular surface of the lens lower cover 130. In another embodiment, as shown in FIG. 4, the inner annular surface of the lens lower cover 130 comprises an inner annular surface of the internal flange 134. In the embodiment, the internal thread 1322 is also disposed on the inner annular surface of the internal flange 134.

In yet another embodiment, as shown in FIG. 3, the lens structure 100 further comprises an adhesive body 150. The adhesive body 150 is adhered between the lens lower cover 130 and the lens barrel 110, such that the lens lower cover 130 is connected to the lens barrel 110. In an embodiment, as shown in FIG. 3, the adhesive body 150 is disposed between the internal thread 1322 of the lens lower cover 130 and the external thread 1162 of the lens barrel 110. In addition, in other embodiments (not shown), the lens lower cover 130 may be connected to the lens barrel 110 by screws in a screwing manner; alternatively, the lens lower cover 130 may be connected to the lens barrel 110 by couplers in a coupling manner or by slides in a sliding manner.

Figure 5:
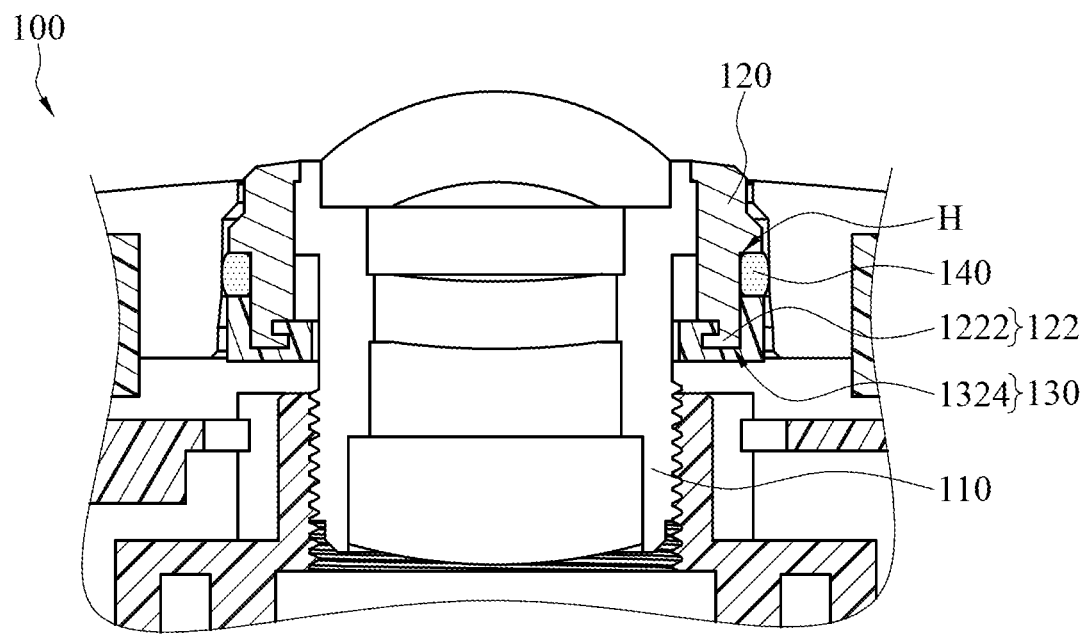
FIG. 5 illustrates a cross sectional view of the lens structure corresponding to the A-A line of FIG. 1 according to another embodiment.

FIG. 5 is a cross sectional view of the lens structure corresponding to the A-A line of FIG. 1 according to another embodiment. Please refer to FIG. 1 and FIG. 5. The lens upper cover 120 is fixed to the lens barrel 110. The lens lower cover 130 abuts against the lens upper cover 120. The lens upper cover 120 and the lens lower cover 130 jointly form an annular slot H to receive the sealing ring 140.

In some embodiments, as shown in FIG. 5, the lower flange 122 of the lens upper cover 120 is provided with a hook portion 1222, and the lens lower cover 130 is provided with a coupling slot 1324. In the embodiment, the hook portion 1222 of the lower flange 122 may enter the coupling slot 1324 to be hooked to the coupling slot 1324 in a rotating manner to have the lens lower cover 130 abut against the lens upper cover 120.

Figure 6:
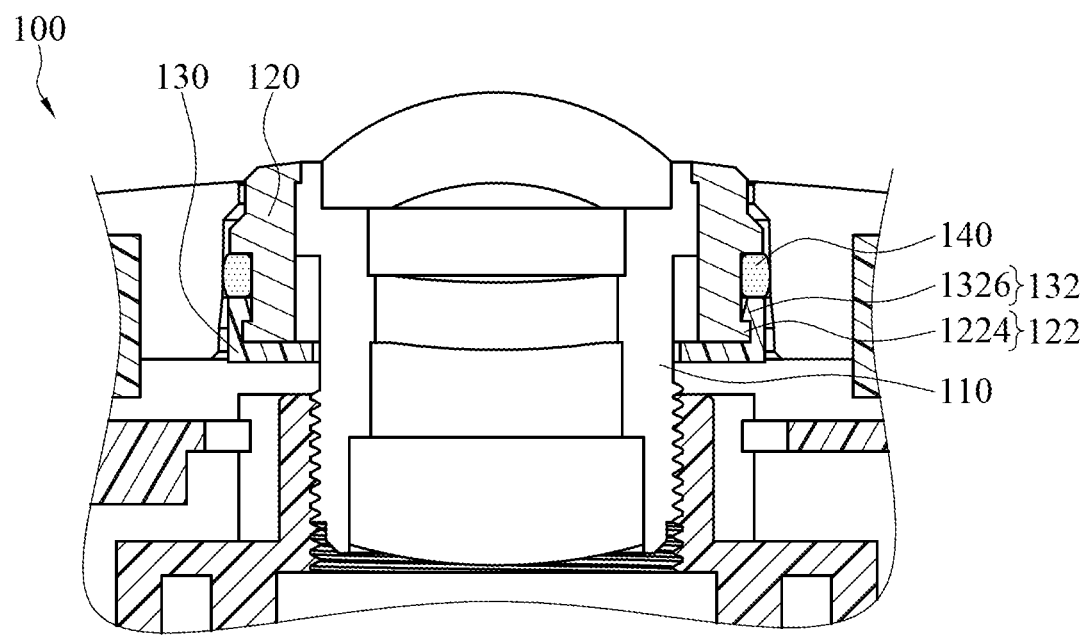
FIG. 6 illustrates a cross sectional view of the lens structure corresponding to the A-A line of FIG. 1 according to another embodiment.

FIG. 6 illustrates a cross sectional view of the lens structure corresponding to the A-A line of FIG. 1 according to another embodiment. Please refer to FIG. 1 and FIG. 6. In some embodiments, the external flange 132 of the lens lower cover 130 may be provided with a first coupling portion 1326. The lower flange 122 of the lens upper cover 120 may be provided with a second coupling portion 1224. The first coupling portion 1326 is coupled to the second coupling portion 1224 to have the lens lower cover 130 abut against the lens upper cover 120.

Figure 7:
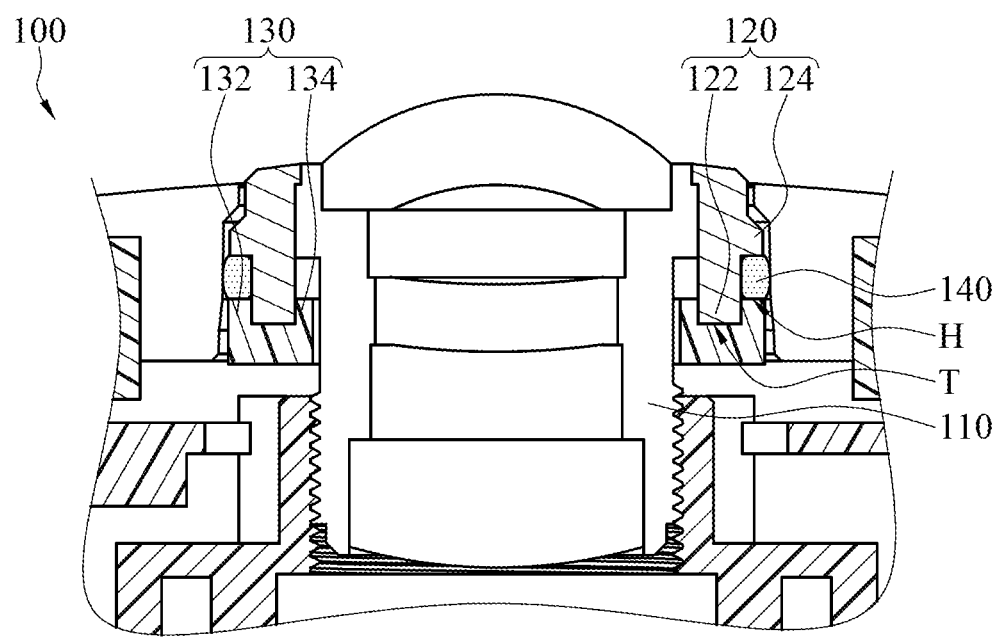
FIG. 7 illustrates a cross sectional view of the lens structure corresponding to the A-A line of FIG. 1 according to yet another embodiment.

FIG. 7 illustrates a cross sectional view of the lens structure corresponding to the A-A line of FIG. 1 according to yet another embodiment. Please refer to FIG. 1 and FIG. 7. In some embodiments, the lower flange 122 of the lens upper cover 120 is coupled to the annular groove space T formed between the external flange 132 and the internal flange 134 of the lens lower cover 130 to have the lens lower cover 130 abut against the lens upper cover 120.

Concisely, the lens cover of embodiments of the instant disclosure may be jointly formed by the lens upper cover and the lens lower cover. In an embodiment, the lens upper cover and the lens lower cover may adopt different materials. Types of the lens upper cover and the lens lower cover may be adjusted to increase mechanical properties (e.g., stability of focusing) and reduce material cost. In an embodiment, the lens upper cover is a metal upper cover, the lens lower cover is a plastic lower cover, and the plastic lower cover is closer to the circuit board inside the lens structure than the metal upper cover is; therefore, transmitting paths for electrostatic charges can be increased to prevent electrostatic charges from being accumulated in the metal upper cover, which results in occurrence of electrostatic discharge that may damage circuits on the circuit board. In another embodiment, the shape and structure of the lens lower cover (e.g., an external flange and/or an internal flange) may be adjusted to not only enhance the strength of combination between the lens lower cover and the lens upper cover but also prevent corners of the metal upper cover from point discharging, which leads to damaging circuits on internal circuit board.

While the instant disclosure has been described by way of example and in terms of the preferred embodiments, it is to be understood that the instant disclosure needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:

1. A lens structure, comprising:
    a lens barrel comprising a front portion and a rear portion respectively at two opposite ends on an axial direction of the lens barrel, the lens barrel further comprising an external annular wall;
    a lens upper cover fixed to the front portion, the lens upper cover comprising a lower flange and an abutting ring radially protruded from an outer periphery of the lower flange, an inner diameter of the lower flange being greater than an outer diameter of the external annular wall;
    a lens lower cover forming an annular shape and abutting against the lens upper cover, the lens lower cover being fixed to the lower flange, the lens lower cover, the lower flange, and the abutting ring jointly forming an annular slot; and
    a sealing ring received in the annular slot,
    wherein the lens upper cover is a metal upper cover, the lens lower cover is an electrically insulating lower cover, the lens lower cover further comprises an external flange, the external flange is protruded towards the abutting ring of the lens upper cover, an inner diameter of the external flange is greater than an outer diameter of the lower flange, the external flange of the lens lower cover covers the lower flange of the lens upper cover.

2. The lens structure of claim 1, wherein the external annular wall of the lens barrel is provided with an external thread, the lens lower cover is provided with an internal thread, and the internal thread of the lens lower cover is screwed to the external thread of the lens barrel.

3. The lens structure of claim 2, further comprising an adhesive body disposed between the external thread and the internal thread.

4. The lens structure of claim 2, wherein the lens lower cover further comprises an internal flange, an outer diameter of the internal flange is less than the inner diameter of the external flange, the lower flange is between the internal flange and the external flange, the external flange of the lens lower cover, the lower flange, and the abutting ring jointly form the annular slot, and the internal thread is disposed on an inner annular surface of the internal flange.

5. The lens structure of claim 1, further comprising an adhesive body adhered between the lens lower cover and the lens barrel.

6. The lens structure of claim 1, wherein the external flange of the lens lower cover, the lower flange, and the abutting ring jointly form the annular slot.

7. The lens structure of claim 6, wherein the lens lower cover further comprises an internal flange, an outer diameter of the internal flange is less than the inner diameter of the lower flange, and the lower flange is between the internal flange and the external flange.

8. The lens structure of claim 1, wherein the lower flange of the lens upper cover is provided with a hook portion, the lens lower cover is provided with a coupling slot, and the hook portion of the lower flange is hooked to the coupling slot.

* * * * *